United States Patent
Kim et al.

(10) Patent No.: US 9,203,344 B2
(45) Date of Patent: Dec. 1, 2015

(54) PIXEL CLOCK GENERATOR, METHOD OF OPERATING THE SAME, AND APPARATUSES INCLUDING THE PIXEL CLOCK GENERATOR

(71) Applicant: Samsung Electronics Co., Ltd., Suwon-Si, Gyeonggi-Do (KR)

(72) Inventors: Sung Jin Kim, Ulsan-si (KR); Tae Ik Kim, Seongnam-si (KR); Se Hyung Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 56 days.

(21) Appl. No.: 13/959,067

(22) Filed: Aug. 5, 2013

(65) Prior Publication Data

US 2014/0036150 A1 Feb. 6, 2014

(30) Foreign Application Priority Data

Aug. 6, 2012 (KR) .................... 10-2012-0085551

(51) Int. Cl.
*H03L 7/00* (2006.01)
*H03B 21/02* (2006.01)
*H04N 5/04* (2006.01)
*H04N 5/12* (2006.01)

(52) U.S. Cl.
CPC ............... *H03B 21/025* (2013.01); *H04N 5/04* (2013.01); *H04N 5/123* (2013.01)

(58) Field of Classification Search
CPC ....................................................... H04N 5/04
USPC ......... 348/537, 536, 505, 533, 511, 497, 194, 348/540, 541, 547, 539; 327/115
See application file for complete search history.

(56) References Cited

U.S. PATENT DOCUMENTS

| | | |
|---|---|---|
| 6,392,642 B1 | 5/2002 | Wu |
| 6,396,486 B1 | 5/2002 | Kuo et al. |
| 8,233,092 B2 * | 7/2012 | Mino ............................ 348/572 |
| 2002/0135705 A1* | 9/2002 | Nakatsuji et al. ............. 348/806 |
| 2006/0197869 A1 | 9/2006 | Wang et al. |
| 2006/0227127 A1 | 10/2006 | Wang et al. |
| 2010/0097527 A1 | 4/2010 | Shin |

FOREIGN PATENT DOCUMENTS

JP 08095535 4/1996

* cited by examiner

*Primary Examiner* — Jefferey Harold
*Assistant Examiner* — Omer Khalid
(74) *Attorney, Agent, or Firm* — Harness, Dickey & Pierce, P.L.C.

(57) ABSTRACT

A method of operating a pixel clock generator (PCG), the method including generating N clock signals according to a control voltage signal, the N clock signals having different phases and N being a natural number; generating M frequency-divided clock signals based on the N clock signals, the M frequency-divided clock signals having different phases and M being a natural number greater than N; and generating a pixel clock signal based on at least two selected ones of the M frequency-divided clock signals.

16 Claims, 11 Drawing Sheets

PIXEL CLOCK GENERATOR, METHOD OF OPERATING THE SAME, AND APPARATUSES INCLUDING THE PIXEL CLOCK GENERATOR

CROSS-REFERENCE TO RELATED APPLICATIONS

This application claims the benefit of Korean Patent Application No. 10-2012-0085551, filed on Aug. 6, 2012, in the Korean Intellectual Property Office, the disclosure of which is incorporated herein in its entirety by reference.

BACKGROUND

Example embodiments relate to a pixel clock generator (PCG), a method of generating a pixel clock signal and/or apparatuses using the method.

Digital televisions (DTVs), in contrast with TVs that use analog signals, denote systems capable of outputting video and audio using digital input signals.

DTVs are capable of using a channel having a narrow bandwidth. DTVs are also capable of receiving multicast programming (i.e., a function of simultaneously broadcasting several programs via a single channel) and providing an electronic program guide (EPG). DTVs may include a pixel clock generator PCG which supplies a clock signal which is used to convert an analog image signal, for example, an RGB (red, green, and blue) signal, into a digital image signal.

SUMMARY

According to an example embodiment of the inventive concepts, there is provided a method of operating a pixel clock generator (PCG). The method including generating N clock signals according to a control voltage signal, the N clock signals having different phases and N being a natural number; generating M frequency-divided clock signals based on the N clock signals, the M frequency-divided clock signals having different phases and M being a natural number greater than N; and generating a pixel clock signal based on at least two selected ones of the M frequency-divided clock signals.

According to an example embodiment, the natural number M may be an integer multiple of the natural number N.

According to an example embodiment, the generating a pixel clock signal may include generating the pixel clock signal such that the generated pixel clock signal is activated in response to an activation of one of the at least two selected frequency-divided clock signals and deactivated in response to an activation of another of the at least two selected frequency-divided clock signals.

According to an example embodiment, the method may further include dividing a frequency of the pixel clock signal to generate a frequency-divided pixel clock signal.

According to another example embodiment of the inventive concepts, there is provided a PCG comprising a voltage controlled oscillator which generates N clock signals according to a control voltage signal, the N clock signals having different phases and N being a natural number; a frequency-divided multiphase signal generating circuit which generates M frequency-divided clock signals respectively having different phases, based on the N clock signals directly received from the voltage controlled oscillator, wherein M denotes a natural number greater than N; and a pixel clock signal modulator which generates a pixel clock signal based on at least two selected ones of the M frequency-divided clock signals.

According to an example embodiment, the pixel clock signal modulator may include a first frequency dividing circuit which divides the frequencies of the at least two selected frequency-divided clock signals and generates at least two twice-frequency-divided clock signals; and a clock modulation circuit which generates the pixel clock signal based on at least two twice-frequency-divided clock signals output from the first frequency dividing circuit.

According to an example embodiment, the pixel clock signal modulator may further include a second frequency dividing circuit generate a frequency-divided pixel clock signal by dividing a frequency of the pixel clock signal.

According to an example embodiment, the PCG may further include a control voltage generator which generates the control voltage signal; and a third frequency dividing circuit which divides a frequency of one of the M frequency-divided clock signals by a frequency division factor to generate a feedback signal, and transmit the feedback signal to the control voltage generator. The frequency division factor of the third frequency dividing circuit may be a product of a frequency division factor of the first frequency dividing circuit and a frequency division factor of the second frequency dividing circuit.

According to an example embodiment, the natural number M may be an integer multiple of the natural number N.

According to an example embodiment, the frequency-divided multiphase signal generating circuit may include a plurality of D flip-flops. A first one of the plurality of D flip-flops may have an output terminal connected to a clock terminal of a second one of the plurality of D flip-flops, and an inverted output terminal of the first one of the plurality of D flip-flops may be connected to both an input terminal of the first one of the plurality of D flip-flops and a clock terminal of a third one of the plurality of D flip-flops.

According to another example embodiment of the inventive concepts, there is provided an analog front-end (AFE) comprising the PCG; and an analog-to-digital converter (ADC) which converts an analog image signal into a digital image signal based on the pixel clock signal.

According to an example embodiment, the pixel clock signal modulator may include a first frequency dividing circuit which divides frequencies of the at least two selected frequency-divided clock signals and generates at least two twice-frequency-divided clock signals; and a clock modulation circuit which generates the pixel clock signal based on the at least two twice-frequency-divided clock signals output from the first frequency dividing circuit.

According to an example embodiment, the pixel clock signal modulator may further include a second frequency dividing circuit which generates a frequency-divided pixel clock signal by dividing a frequency of the pixel clock signal.

According to an example embodiment, the AFE may further include a control voltage generator which generates the control voltage signal; and a third frequency dividing circuit which divides a frequency of one of the M frequency-divided clock signals by a frequency division factor to generate a feedback signal, and transmits the feedback signal to the control voltage generator. The frequency division factor of the third frequency dividing circuit may be a product of a frequency division factor of the first frequency dividing circuit and a frequency division factor of the second frequency dividing circuit.

According to another example embodiment of the inventive concepts, there is provided a digital television (DTV) system including the AFE; a digital signal processor (DSP) which processes the digital image signal received from the AFE to generate image data and adjusts a horizontal synchronization frequency of the image data using the frequency-divided pixel clock signal; and a display unit which displays the image data.

At least one example embodiment relates to a pixel clock generator (PCG).

In one embodiment, the PGC includes a multiphase signal generator configured to generate frequency-divided clock signals according to a received horizontal synchronization signal, the frequency-divided clock signals each having a different phase; and a pixel clock signal modulator configured to generate a pixel clock signal TLLC and a frequency-divided pixel clock signal based on at least two of the frequency-divided clock signals.

In one embodiment, the multiphase signal generator includes a control voltage generator configured to generate a control voltage signal that varies based on a variation between phases of the horizontal synchronization signal and a feedback signal; a voltage controlled oscillator configured to generate clock signals based on the control voltage signal, the generated clock signals each having different phases, a number N of the clock signals being a natural number; a frequency-divided multiphase signal generating circuit configured to generate the frequency-divided clock signals based on the clock signals, the frequency-divided clock signals having frequencies that are integer multiples of frequencies of respective ones of the clock signals, a number M of the frequency-divided clock signals being a natural number greater than the number N of the clock signals; and a frequency dividing circuit configured to divide a frequency of one of the M frequency-divided clock signals by a frequency division factor to generate a feedback signal, and transmit the feedback signal to the control voltage generator.

In one embodiment, the frequency-divided multiphase signal generating circuit is configured to receive the clock signals directly from the voltage controlled oscillator.

In one embodiment, the pixel clock signal modulator includes a selection circuit configured to select the at least two frequency divided clock signals from the M frequency-divided clock signals; a first frequency dividing circuit configured to generate at least two twice-frequency-divided clock signals having frequencies that are each an integer multiple of a frequency of respective ones of the at least two selected frequency-divided clock signals; a clock modulation circuit configured to generate the pixel clock signal based on the selected at least two twice-frequency-divided clock signals; and a second frequency dividing circuit configured to generate a frequency-divided pixel clock signal having a frequency that is an integer multiple a frequency of the pixel clock signal.

At least one embodiment relates to a digital television (DTV) system. In one embodiment, the DTV system includes an analog front end (AFE) and a digital signal processor (DSP). The AFE including the pixel clock generator (PCG) and an analog-to-digital converter (ADC) configured to convert an analog image signal into a digital image signal according to the pixel clock signal generated by the PCG. The digital signal processor (DSP) is configured to generate image data, from the digital image signal, the generated image data having a horizontal synchronization frequency set according to the frequency-divided pixel clock signal received from the pixel clock generator.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
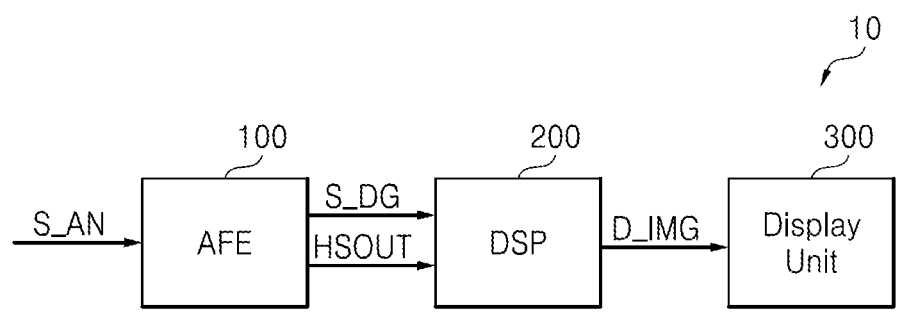
FIG. 1 is a block diagram of a digital television (DTV) system according to an example embodiment of the inventive concepts.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments of the present invention will now be described more fully with reference to the accompanying drawings in which some example embodiments of the invention are shown. In the drawings, the thicknesses of layers and regions are exaggerated for clarity.

FIG. 1 is a block diagram of a digital television (DTV) system 10 according to an example embodiment of the inventive concepts.

Referring to FIG. 1, the DTV system 10 may be implemented by using a satellite DTV system, a cable DTV system, a handheld DTV system, a terrestrial DTV system, or the like. The DTV system 10 may include a high-definition (HD) TV system.

The handheld DTV system may be implemented in a mobile phone, a smart phone, a tablet PC, an automotive navigation device, a personal digital assistant (PDA), or a portable multimedia player (PMP).

The DTV system 10 may include an analog front-end (AFE) 100, a digital signal processor (DSP) 200, and a display unit 300.

The AFE 100 may receive an analog image signal S_AN, for example, an RGB (red, green, and blue) signal, and may convert the analog image signal S_AN into a digital image signal S_DG in synchronization with a synchronization signal included in the analog image signal S_AN.

According to an example embodiment, the analog image signal S_AN may be a signal that is received by the AFE 100 via an antenna (not shown) and a tuner (not shown) through wireless communication. According to another embodiment, the analog image signal S_AN may be a signal into which a digital image signal, for example, a high-definition multimedia interface (HDMI) signal, is received by the DTV system 10 via wired communication and then converted using a converter.

The AFE 100 may transmit a frequency-divided pixel clock signal HSOUT together with the digital image signal S_DG to the DSP 200. According to an example embodiment, the frequency-divided pixel clock signal HSOUT may be transmitted to the DSP 200 to adjust a horizontal synchronization frequency of an image which is to be displayed on the display unit 300. The digital image signal S_DG and the frequency-divided pixel clock signal HSOUT will be described in detail with reference to FIG. 7.

The DSP 200 may process the digital image signal S_DG received from the AFE 100 and output image data D_IMG according to a result of the processing.

The display unit 300 may display the image data D_IMG received from the DSP 200. According to an example embodiment, the display unit 300 may display the image data D_IMG on a display, for example, a Liquid Crystal Display (LCD), a Light Emitting Diode (LED) display, an Organic Light Emitting Diode (OLED) display, an Active Matrix OLED (AMOLED) display, or a flexible display.

Figure 2:
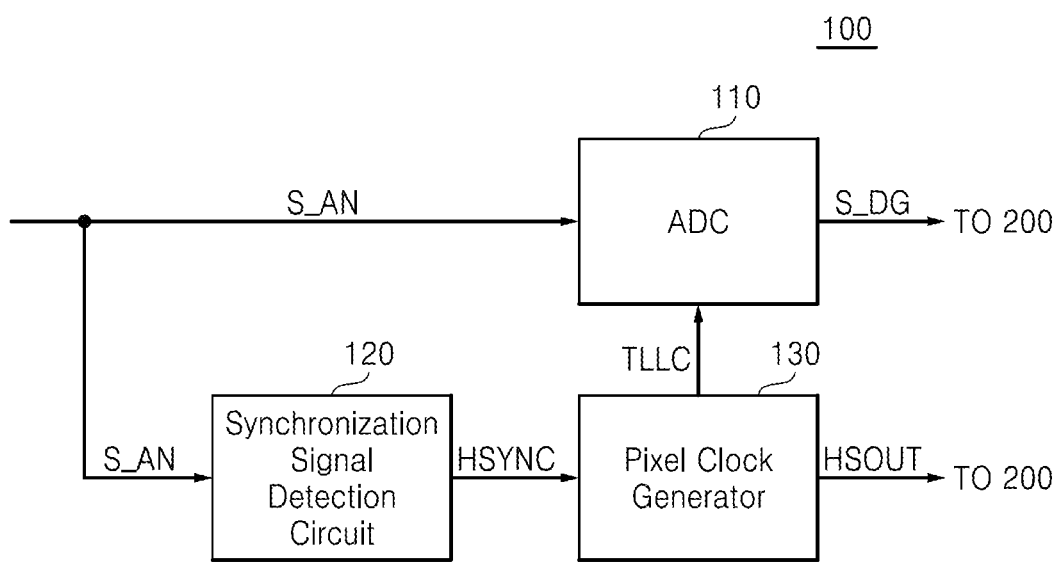
FIG. 2 is a block diagram of an analog front-end (AFE) included in the DTV system illustrated in FIG. 1.

FIG. 2 is a block diagram of the AFE 100 according to an example embodiment.

Referring to FIGS. 1 and 2, the AFE 100 may include an analog-to-digital converter (ADC) 110, a synchronization signal detection circuit 120, and a pixel clock generator (PCG) 130. According to an example embodiment, the components of the AFE 100 may be integrated into a single chip.

The ADC 110 may receive the analog image signal S_AN and may convert the analog image signal S_AN into the digital image signal S_DG in synchronization with a pixel clock signal TLLC received from the PCG 130. The ADC 110 may transmit the digital image signal S_DG to the DSP 200.

The synchronization signal detection circuit 120 may receive the analog image signal S_AN and detect the synchronization signal included in the analog image signal S_AN, for example, a horizontal synchronization signal HSYNC. The synchronization signal detection circuit 120 may transmit the detected synchronization signal, for example, the horizontal synchronization signal HSYNC, to the PCG 130.

The PCG 130 may generate the pixel clock signal TLLC and the frequency-divided pixel clock signal HSOUT, based on the horizontal synchronization signal HSYNC. The PCG 130 may transmit the pixel clock signal TLLC to the ADC 110 and may transmit the frequency-divided pixel clock signal HSOUT to the DSP 200. A structure and an operation of the PCG 130 will now be described in detail with reference to FIGS. 3 through 9.

Figure 3:
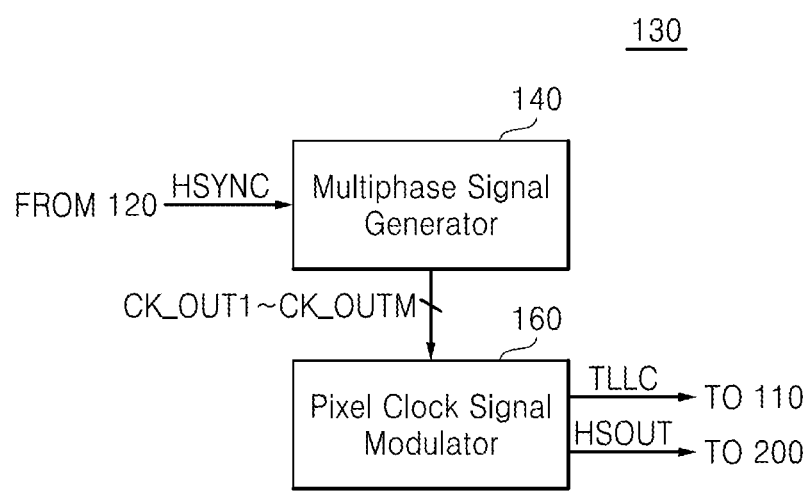
FIG. 3 is a block diagram of a pixel clock generator (PCG) included in the AFE illustrated in FIG. 2.

FIG. 3 is a block diagram of the PCG 130 according to an example embodiment.

Referring to FIGS. 1 through 3, the PCG 130 may include a multiphase signal generator 140 and a pixel clock signal modulator 160.

The multiphase signal generator 140 may generate M frequency-divided clock signals CK_OUT1 through CK_OUTM having different phases, based on the horizontal synchronization signal HSYNC received from the synchronization signal detection circuit 120. The multiphase signal generator 140 and the M frequency-divided clock signals CK_OUT1 through CK_OUTM generated by the multiphase signal generator 140 will be described in detail later with reference to FIGS. 4 through 6.

The pixel clock signal modulator 160 may receive the M frequency-divided clock signals CK_OUT1 through CK_OUTM from the multiphase signal generator 140, and generate the pixel clock signal TLLC and the frequency-divided pixel clock signal HSOUT based on the M frequency-divided clock signals CK_OUT1 through CK_OUTM. The pixel clock signal modulator 160 may transmit the pixel clock signal TLLC to the ADC 110 and may transmit the frequency-divided pixel clock signal HSOUT to the DSP 200. A structure and an operation of the pixel clock signal modulator 160 will be described in detail later with reference to FIGS. 7 through 9.

Figure 4:
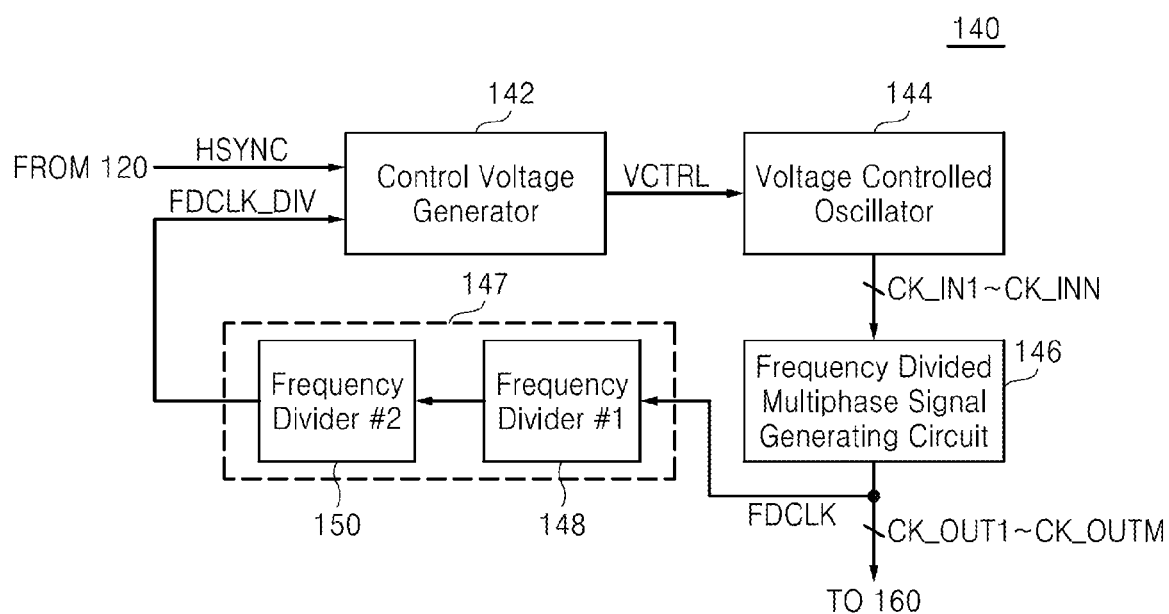
FIG. 4 is a block diagram of a multiphase signal generator included in the PCG illustrated in FIG. 3.

FIG. 4 is a block diagram of the multiphase signal generator 140 according to an example embodiment.

Referring to FIGS. 3 and 4, the multiphase signal generator 140 may include a control voltage generator 142, a voltage controlled oscillator 144, a frequency-divided multiphase signal generating circuit 146, and a frequency dividing circuit 147.

The control voltage generator 142 may compare the phase and frequency of the horizontal synchronization signal HSYNC received from the synchronization signal detection circuit 120 with those of a frequency-divided clock signal FDCLK_DIV (e.g. a feedback signal) received from the frequency dividing circuit 147, and may provide a control voltage VCTRL corresponding to a result of the comparison to the voltage controlled oscillator 144. According to an example embodiment, the control voltage generator 142 may include a phase-frequency detector (PFD) (not shown) for comparing the phase and frequency of the horizontal synchronization signal HSYNC with those of the frequency-divided clock signal FDCLK_DIV, and a charge pump (not shown) and a loop filter (not shown) for generating the control voltage VCTRL according to a result of the comparison.

The voltage controlled oscillator 144 may generate N (where N denotes a natural number) clock signals CK_IN1 through CK_INN having different phases, according to the control voltage VCTRL. The frequencies of the N clock signals CK_IN1 through CK_INN may be determined according to the control voltage VCTRL.

The frequency-divided multiphase signal generating circuit 146 may generate the M (where M denotes a natural number greater than N) frequency-divided clock signals CK_OUT1 through CK_OUTM having different phases, based on the N clock signals CK_IN1 through CK_INN received from the voltage controlled oscillator 144. For example, the frequency-divided multiphase signal generating circuit 146 may allow a plurality of frequency-divided clock signals to have different phases, when dividing the frequency of each of the N clock signals CK_IN1 through CK_INN to generate the frequency-divided clock signals. According to an example embodiment, M may be an integer multiple of N.

According to an example embodiment, the frequency-divided multiphase signal generating circuit 146 may include a plurality of flip-flops for dividing the frequency of each of the N clock signals CK_IN1 through CK_INN to generate a plurality of frequency-divided clock signals. According to another example embodiment, the frequency-divided multiphase signal generating circuit 146 may further include a plurality of delay buffers (not shown), for example, inverters, for allowing the frequency-divided clock signals to have different phases. A structure of the frequency-divided multiphase signal generating circuit 146 will be described later in detail with reference to FIG. 5.

A relationship between the N clock signals CK_IN1 through CK_INN received by the frequency-divided multiphase signal generating circuit 146 and the M frequency-divided clock signals CK_OUT1 through CK_OUTM output by the frequency-divided multiphase signal generating circuit 146 will be described in detail later with reference to FIG. 6. The frequency-divided multiphase signal generating circuit 146 may output the M frequency-divided clock signals CK_OUT1 through CK_OUTM having different phases to the pixel clock signal modulator 160. The frequency-divided multiphase signal generating circuit 146 may transmit one of the M frequency-divided clock signals CK_OUT1 through CK_OUTM, namely, a frequency-divided clock signal FDCLK, to the frequency dividing circuit 147.

The frequency dividing circuit 147 may divide the frequency of the frequency-divided clock signal FDCLK received from the frequency-divided multiphase signal generating circuit 146 one more time, to generate the frequency-divided clock signal FDCLK_DIV as a feedback signal, and may transmit the frequency-divided clock signal FDCLK_DIV to the control voltage generator 142. The frequency dividing circuit 147 may include a first frequency divider 148 and a second frequency divider 150. The first frequency divider 148 may have a first frequency division factor, and the second frequency divider 150 may have a second frequency division factor. In this case, the frequency dividing circuit 147 may divide the frequency of the frequency-divided clock signal FDCLK by a product of the first frequency division factor and the second frequency division factor to generate the frequency-divided clock signal FDCLK_DIV, and may transmit the frequency-divided clock signal FDCLK_DIV to the control voltage generator 142. The frequency dividing circuit 147 are functionally or logically divided into the first frequency divider 148 and the second frequency divider 150, but the first frequency divider 148 and the second frequency divider 150 are not necessarily separate circuits.

Figure 5:
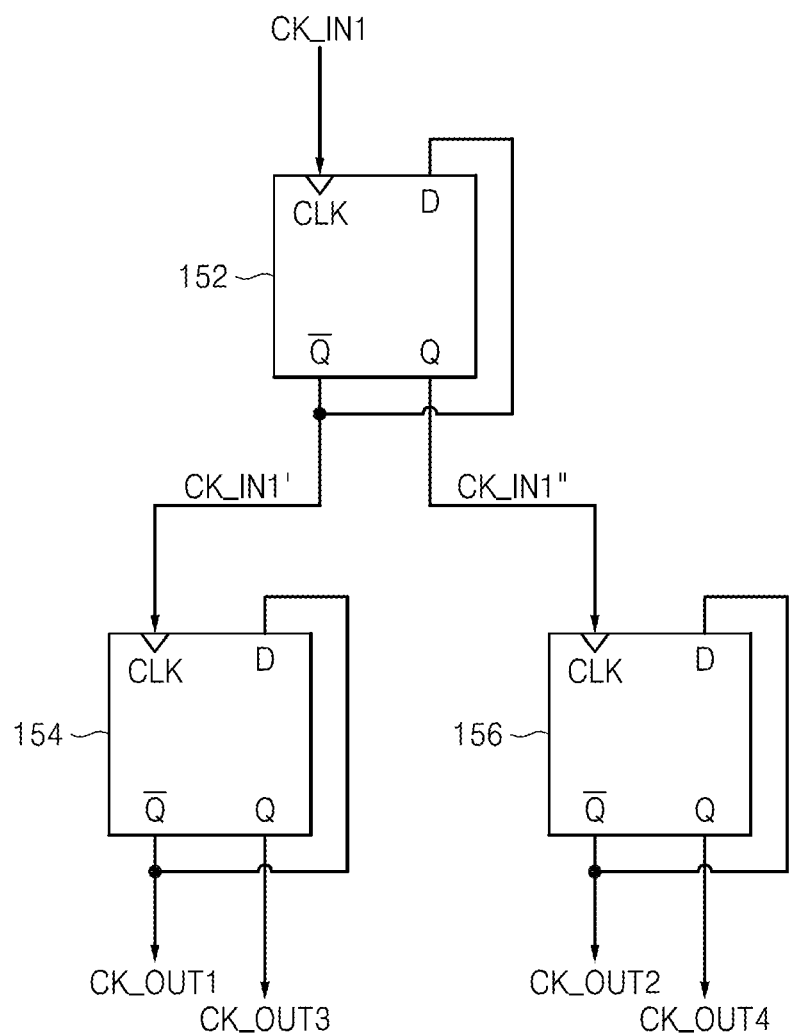
FIG. 5 is a circuit diagram of a part of a frequency-divided multiphase signal generating circuit included in the multiphase signal generator illustrated in FIG. 4, according to an example embodiment of the inventive concepts.

FIG. 5 is a circuit diagram of a part 146-1 of the frequency-divided multiphase signal generating circuit 146, according to an example embodiment of the inventive concepts. FIG. 6 is a timing diagram for explaining a relationship between clock signals received by the part 146-1 of the frequency-divided multiphase signal generating circuit 146 and clock signals output by the part of the frequency-divided multiphase signal generating circuit 146.

Figure 6:
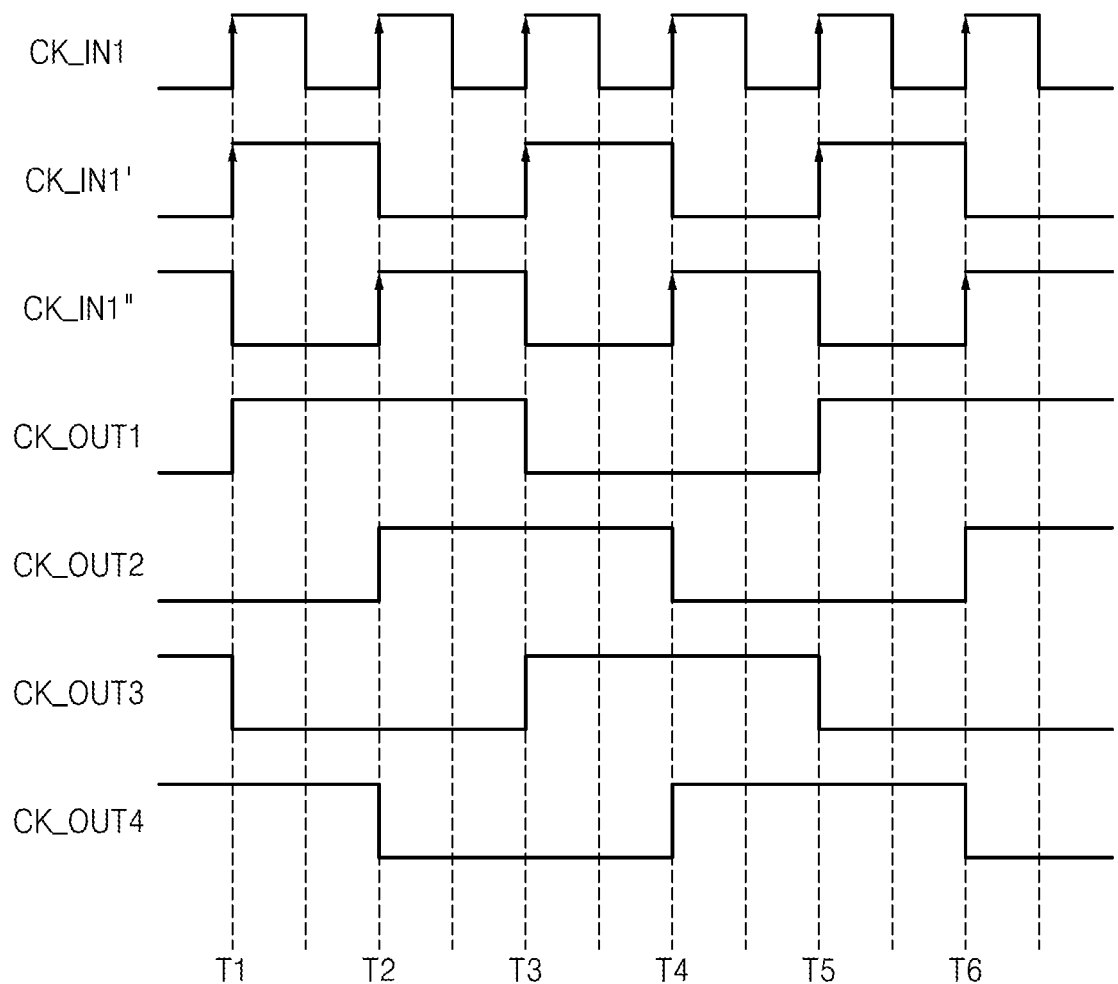
FIG. 6 is a timing diagram for explaining a relationship between clock signals received by the part of the frequency-divided multiphase signal generating circuit of FIG. 5 and clock signals output by the part of the frequency divided multiphase signal generating circuit of FIG. 5.

Referring to FIGS. 4 through 6, the part 146-1 of the frequency-divided multiphase signal generating circuit 146 may denote a circuit for dividing the frequency of one of the N clock signals CK_IN1 through CK_INN (for example, the clock signal CK_IN1). According to an example embodiment, the frequency-divided multiphase signal generating circuit 146 may include N circuits each having the same structure as the part 146-1 of the frequency divided multiphase signal generating circuit 146.

The clock signal CK_IN1 denotes one of the N clock signals CK_IN1 through CK_INN received by the frequency-divided multiphase signal generating circuit 146. Intermediate clock signals CK_IN1' and CK_IN1' denote clock signals that a first logic circuit 152 generates by dividing the frequency of the clock signal CK_IN1.

A plurality of frequency-divided clock signals CK_OUT1 through CK_OUT4 denote clock signals that a second logic circuit 154 and a third logic circuit 156 generate by respectively dividing the frequencies of the intermediate clock signals CK_IN1' and CK_IN1". The frequency-divided clock signals CK_OUT1 through CK_OUT4 may denote some of the M frequency-divided clock signals CK_OUT1 through CK_OUTM. Although the frequency of the clock signal CK_IN1 is divided by a frequency division factor of '4' in FIGS. 5 and 6 for convenience of explanation, the frequency division factor is not limited to '4'.

Referring to FIGS. 4 through 6, the part 146-1 of the frequency-divided multiphase signal generating circuit 146 may include the first logic circuit 152, the second logic circuit 154, and the third logic circuit 156. According to an example embodiment, each of the first logic circuit 152, the second logic circuit 154, and the third logic circuit 156 may be implemented using a D flip flop.

The first logic circuit 152 may receive the clock signal CK_IN1 from the voltage controlled oscillator 144 and may output the intermediate clock signals CK_IN1' and CK_IN1', which are toggled at rising edges of the clock signal CK_IN1, for example, at first through sixth points of time T1 through T6. When an input terminal D of the first logic circuit 152 initially has a high level, for example, a value of '1', the intermediate clock signal CK_IN1' may be toggled to a high level, for example, a value of '1', in response to some of the rising edges of the clock signal CK_IN1.

Since the intermediate clock signal CK_IN1" is output from an output terminal Q of the first logic circuit 152, there is a difference of 180 degrees between the phases of the intermediate clock signal CK_IN1" and the intermediate clock signal CK_IN1' output from an inverted output terminal /Q of the first logic circuit 152.

The second logic circuit 154 may receive the intermediate clock signal CK_IN1 from the first logic circuit 152 and may output the frequency-divided clock signals CK_OUT1 and CK_OUT3, which are toggled at the rising edges of the intermediate clock signal CK_IN1, for example, at first, third, and fifth points of time T1, T3, and T5.

Since the frequency-divided clock signal CK_OUT1 is output from an inverted output terminal /Q of the second logic circuit 154, there is a difference of 180 degrees between the phases of the frequency-divided clock signal CK_OUT1 and the frequency-divided clock signal CK_OUT3 output from an output terminal Q of the second logic circuit 154.

The third logic circuit 156 may receive the intermediate clock signal CK_IN1" from the first logic circuit 152 and may output the frequency-divided clock signals CK_OUT2 and CK_OUT4, which are toggled at the rising edges of the intermediate clock signal CK_IN1', for example, at second, fourth, and sixth points of time T2, T4, and T6.

Since the frequency-divided clock signal CK_OUT2 is output from an inverted output terminal /Q of the third logic circuit 156, there is a difference of 180 degrees between the phases of the frequency-divided clock signal CK_OUT2 and the frequency-divided clock signal CK_OUT4 output from an output terminal Q of the third logic circuit 156.

The frequency of each of the frequency-divided clock signals CK_OUT1 through CK_OUT4 is ¼ the frequency of the clock signal CK_IN1, and the frequency-divided clock signals CK_OUT1 through CK_OUT4 have different phases. In other words, the frequency-divided multiphase signal generating circuit 146 may generate the four frequency-divided clock signals CK_OUT1 through CK_OUT4 each having a frequency of ¼ the frequency of the clock signal CK_IN1 and respectively having different phases, from the clock signal CK_IN1 from among the N clock signals CK_IN1 through CK_INN.

In this way, the frequency-divided multiphase signal generating circuit 146 may also generate four frequency-divided clock signals from each of the other clock signals. For example, when the frequency-divided multiphase signal generating circuit 146 receives 8 clock signals, the frequency-divided multiphase signal generating circuit 146 may generate 32 frequency-divided clock signals respectively having different phases (in this case, N=8, and M=32).

Figure 7:
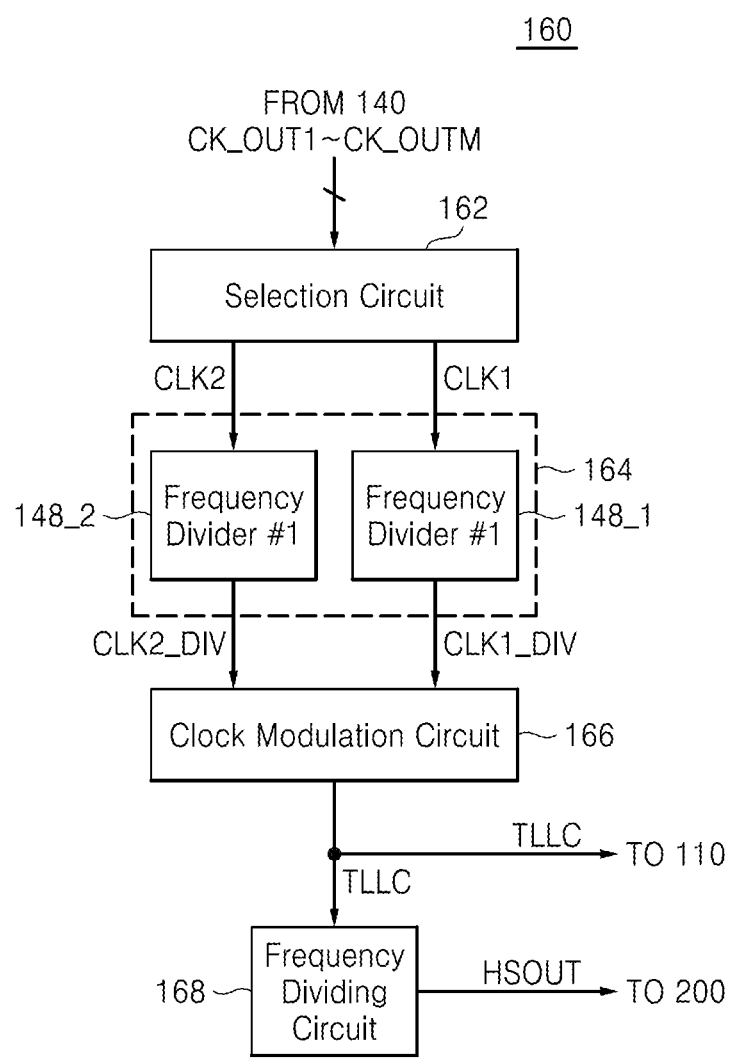
FIG. 7 is a block diagram of a pixel clock signal modulator included in the PCG of FIG. 3.

FIG. 7 is a block diagram of the pixel clock signal modulator 160 of FIG. 3 according to an example embodiment.

Referring to FIGS. 3 and 7, the pixel clock signal modulator 160 may include a selection circuit 162, a frequency dividing circuit 164, a clock modulation circuit 166, and a frequency dividing circuit 168.

The selection circuit 162 may receive the M frequency-divided clock signals CK_OUT1 through CK_OUTM from the multiphase signal generator 140 and may select and output at least two frequency-divided clock signals, namely, clock signals CLK1 and CLK2, from among the M frequency-divided clock signals CK_OUT1 through CK_OUTM.

According to an example embodiment, the selection circuit 162 may select the two frequency-divided clock signals CLK1 and CLK2 based on a signal (not shown) for selecting the phase of the pixel clock signal TLLC and a signal (not shown) for selecting the duty ratio of the pixel clock signal TLLC. According to another embodiment, the selection circuit 162 may include a multiplexer (not shown).

The frequency dividing circuit 164 may further divide the frequencies of the two frequency-divided clock signals CLK1 and CLK2 output from the selection circuit 162 to generate twice-frequency-divided clock signals CLK1_DIV and CLK2_DIV, respectively, and may transmit the twice-frequency-divided clock signals CLK1_DIV and CLK2_DIV to the clock modulation circuit 166. According to an example embodiment, the frequency dividing circuit 164 may include two first frequency dividers 148_1 and 148_2 for respectively dividing the frequencies of the two frequency-divided clock signals CLK1 and CLK2 output from the selection circuit 162.

An operation of each of the first frequency dividers 148_1 and 148_2 is substantially the same as that of the first frequency divider 148 of FIG. 4. In this case, the first frequency divider 148_1 may output the twice-frequency-divided clock signal CLK1_DIV by dividing the frequency of the frequency-divided clock signal CLK1 by a first frequency division factor, and the first frequency divider 148_2 may output the twice-frequency-divided clock signal CLK2_DIV by dividing the frequency of the frequency-divided clock signal CLK2 by the first frequency division factor.

The clock modulation circuit 166 may receive the twice-frequency-divided clock signals CLK1_DIV and CLK2_DIV from the frequency dividing circuit 164 and may generate the pixel clock signal TLLC based on the twice-frequency-divided clock signals CLK1_DIV and CLK2_DIV. A structure and an operation of the clock modulation circuit 166 will be described in detail later with reference to FIGS. 8 and 9. The clock modulation circuit 166 may transmit the pixel clock signal TLLC to the ADC 110 of FIG. 2 and the frequency dividing circuit 168.

The frequency dividing circuit 168 may divide the frequency of the pixel clock signal TLLC received from the clock modulation circuit 166 to generate the frequency-divided pixel clock signal HSOUT, and may transmit the frequency-divided pixel clock signal HSOUT to the DSP 200 of FIG. 1. According to an example embodiment, the frequency dividing circuit 168 may be implemented by using the second frequency divider 150 of FIG. 4. In this case, the frequency dividing circuit 168 may divide the frequency of the pixel clock signal TLLC by a second frequency division factor, and a product of the frequency division factor of the frequency division circuit 164 (for example, the first frequency division factor) and the frequency division factor of the frequency division circuit 168 (for example, the second frequency division factor) may be equal to a frequency division factor of the frequency dividing circuit 147 of FIG. 4 (for example, the first frequency division factor multiplied by the second frequency division factor).

Figure 8:
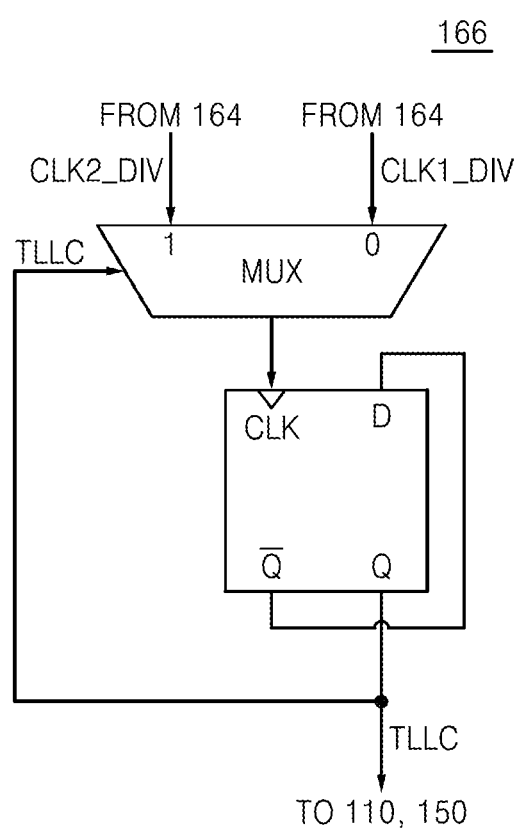
FIG. 8 is a block diagram of a clock modulation circuit included in the pixel clock signal modulator of FIG. 7.
Figure 9:
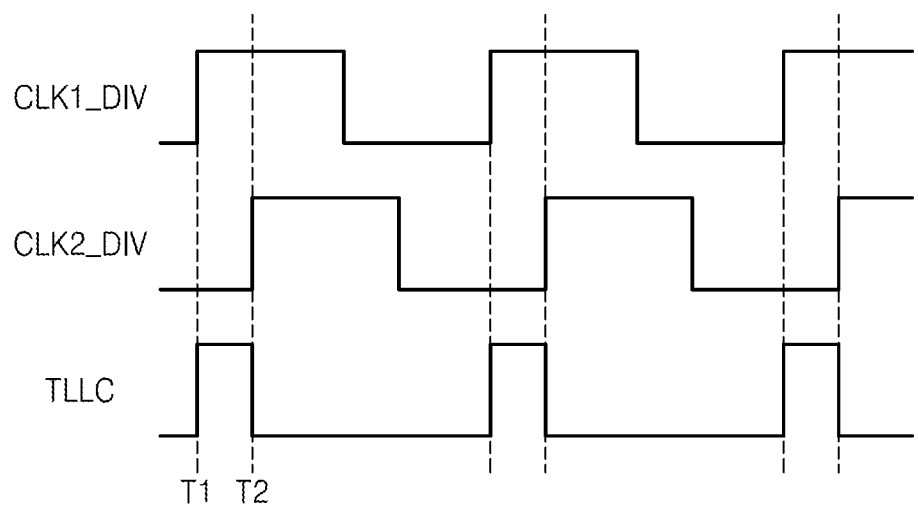
FIG. 9 is a timing diagram for explaining a method in which the clock modulation circuit of FIG. 8 generates a pixel clock signal.

FIG. 8 is a block diagram of the clock modulation circuit 166 according to an example embodiment. FIG. 9 is a timing diagram for explaining a method in which the clock modulation circuit 166 illustrated in FIG. 8 generates the pixel clock signal TLLC.

Referring to FIGS. 7 through 9, the clock modulation circuit 166 may be implemented by using a multiplexer (MUX) and a flip flop, for example, a D flip flop.

When the pixel clock signal TLLC initially has a low level, for example, a value of '0', the MUX supplies the frequency-divided clock signal CLK1_DIV to a clock terminal CLK of the flip flop.

As the frequency-divided clock signal CLK1_DIV is activated at a first point of time T1 and thus has a high level, for example, a value of '1', the pixel clock signal TLLC is also activated and toggled to a high level, for example, a value of '1'. Thereafter, while the pixel clock signal TLLC having the high level, for example, the value of '1', is being fed back to the MUX, the MUX supplies the frequency-divided clock signal CLK2_DIV to the clock terminal CLK of the flip flop.

As the frequency-divided clock signal CLK2_DIV is activated at a second point of time T2 and thus has a high level, for example, a value of '1', an output of an inverted output terminal IQ of the flip flop, for example, '0', is input to an input terminal D of the flip flop, and the pixel clock signal TLLC having a low level, for example, a value of '0', is output from an output terminal Q of the flip flop. In other words, the clock modulation circuit 166 may generate the pixel clock signal TLLC, which is activated in response to (or in synchronization with) the activation of the frequency-divided clock signal CLK1_DIV and deactivated in response to (or in synchronization with) the activation of the frequency-divided clock signal CLK2_DIV.

Figure 10:
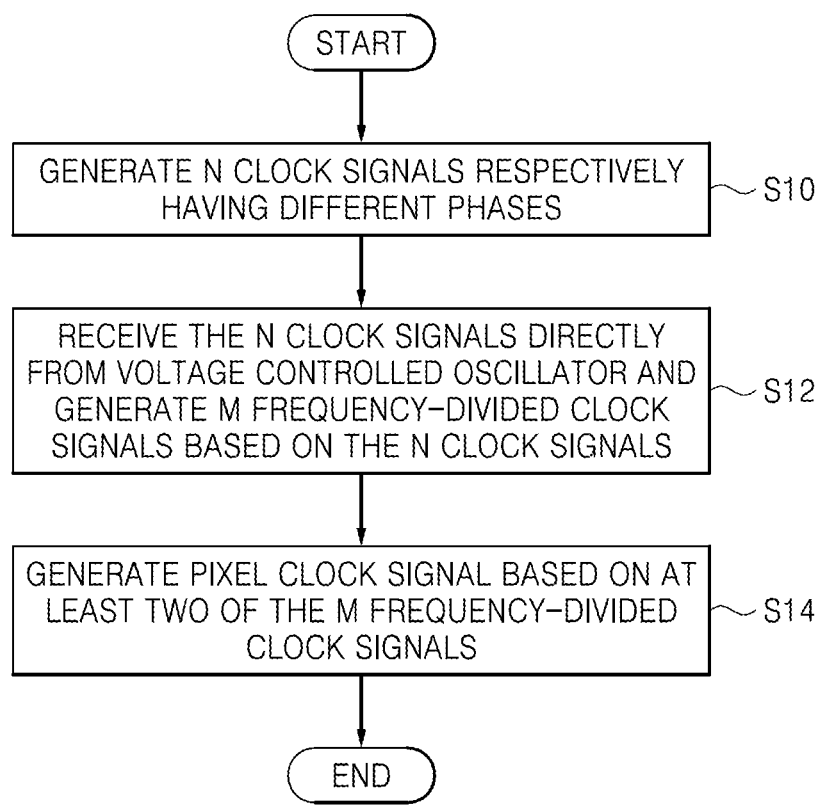
FIG. 10 is a flowchart of a method of operating the PCG of FIG. 3, according to an example embodiment of the inventive concepts.

FIG. 10 is a flowchart of a method of operating the PCG 130, according to an example embodiment of the inventive concepts.

Referring to FIGS. 4 through 10, in operation S10, the voltage controlled oscillator 144 may generate N clock signals CK_IN1 through CK_INN respectively having different phases, according to the control voltage VCTRL.

In operation S12, the frequency-divided multiphase signal generating circuit 146 may receive the N clock signals CK_IN1 through CK_INN from the voltage controlled oscillator 144 and generate the M frequency-divided clock signals CK_OUT1 through CK_OUTM respectively having different phases based on the N clock signals CK_IN1 through CK_INN.

In operation S14 the pixel clock signal modulator 160 may generate the pixel clock signal TLLC based on at least two of the M frequency-divided clock signals CK_OUT1 through CK_OUTM, namely, based on clock signals CLK1 and CLK2.

Figure 11:
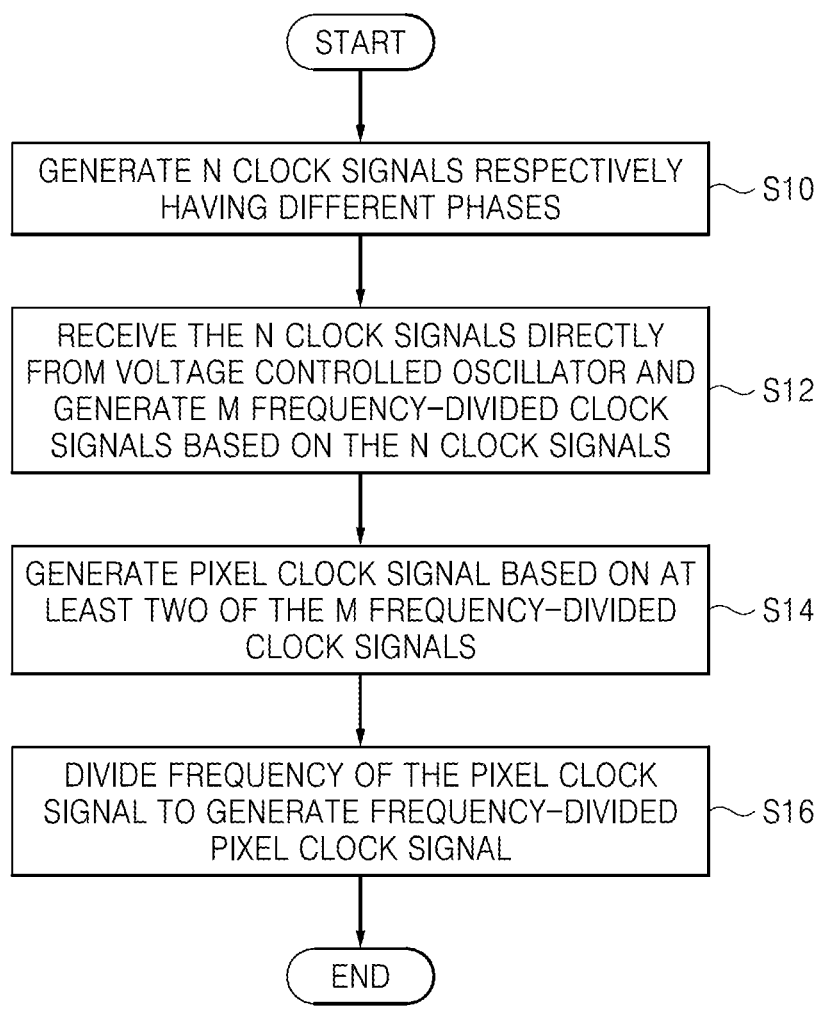
FIG. 11 is a flowchart of a method of operating the PCG of FIG. 3, according to another example embodiment of the inventive concepts.

FIG. 11 is a flowchart of a method of operating the PCG 130, according to another example embodiment of the inventive concepts.

Referring to FIGS. 4 through 11, in operation S16, the frequency dividing circuit 168 may divide the frequency of the pixel clock signal TLLC to generate the frequency-divided pixel clock signal HSOUT. According to an example embodiment, the frequency dividing circuit 168 may transmit the frequency-divided pixel clock signal HSOUT to the DSP 200.

In the example embodiments, a pixel clock signal is generated according to a plurality of frequency-divided clock signals that have different phases and are generated based on each of a plurality of clock signals received from a voltage controlled oscillator, thus simplifying the structure of a PCG. The simplification of the structure of the PCG may lead to a reduction of the area occupied by the PCG. Moreover, the simplification of the structure of the PCG may also lead to reductions of design costs and test costs of the PCG.

While the example embodiments of inventive concepts have been particularly shown and described with reference to example embodiments thereof, it will be understood that various changes in form and details may be made therein without departing from the spirit and scope of the following claims.

What is claimed is:

1. A pixel clock generator (PCG) comprising:
    a voltage controlled oscillator configured to generate N clock signals according to a control voltage signal, the N clock signals having different phases and N being a natural number;
    a frequency-divided multiphase signal generating circuit configured to generate M frequency-divided clock signals based on the N clock signals received from the voltage controlled oscillator, the M frequency-divided clock signals having different phases and M being a natural number greater than N; and
    a pixel clock signal modulator configured to generate a pixel clock signal based on at least two selected ones of the M frequency-divided clock signals, the pixel clock signal modulator including a frequency dividing circuit configured to divide frequencies of each of the at least two selected ones of the M frequency-divided clock signals to generate twice-frequency-divided clock signals, and the pixel clock signal is generated based on the twice-frequency-divided clock signals.

2. The PCG of claim 1, wherein the pixel clock signal modulator comprises:
    a first frequency dividing circuit configured to divide frequencies of the at least two selected frequency-divided clock signals and generate at least two of the twice-frequency-divided clock signals; and
    a clock modulation circuit configured to generate the pixel clock signal based on the at least two twice-frequency-divided clock signals output from the first frequency dividing circuit.

3. The PCG of claim 2, wherein the pixel clock signal modulator further comprises:
    a second frequency dividing circuit configured to generate a frequency-divided pixel clock signal by dividing a frequency of the pixel clock signal.

4. The PCG of claim 3, further comprising:
    a control voltage generator configured to generate the control voltage signal; and
    a third frequency dividing circuit configured to divide a frequency of one of the M frequency-divided clock signals by a frequency division factor to generate a feedback signal, and transmit the feedback signal to the control voltage generator, wherein
        the frequency division factor of the third frequency dividing circuit is a product of a frequency division factor of the first frequency dividing circuit and a frequency division factor of the second frequency dividing circuit, and
        the frequency-divided multiphase signal generating circuit is configured to receive the N clock signals directly from the voltage controlled oscillator.

5. The PCG of claim 1, wherein the natural number M is an integer multiple of the natural number N.

6. A pixel clock generator (PCG) comprising:
    a voltage controlled oscillator configured to generate N clock signals according to a control voltage signal, the N clock signals having different phases and N being a natural number;
    a frequency-divided multiphase signal generating circuit configured to generate M frequency-divided clock signals based on the N clock signals received from the voltage controlled oscillator, the M frequency-divided clock signals having different phases and M being a natural number greater than N; and
    a pixel clock signal modulator configured to generate a pixel clock signal based on at least two selected ones of the M frequency-divided clock signals, wherein the frequency-divided multiphase signal generating circuit: includes,
        a plurality of D flip-flops, a first one of the plurality of D flip-flops having, an output terminal connected to a clock terminal of a second one of the plurality of D flip-flops, and
an inverted output terminal connected to both an input terminal of the first one of the plurality of D flip-flops and a clock terminal of a third one of the plurality of D flip-flops.

7. An analog front-end (AFE) comprising:
the pixel clock generator (PCG) of claim 1; and
an analog-to-digital converter (ADC) configured to convert an analog image signal into a digital image signal based on the pixel clock signal.

8. The AFE of claim 7, wherein the pixel clock signal modulator comprises:
a first frequency dividing circuit configured to divide frequencies of the at least two selected frequency-divided clock signals and generate at least two of the twice-frequency-divided clock signals; and
a clock modulation circuit configured to generate the pixel clock signal based on the at least two twice-frequency-divided clock signals output from the first frequency dividing circuit.

9. The AFE of claim 8, wherein the pixel clock signal modulator further comprises:
a second frequency dividing circuit configured to generate a frequency-divided pixel clock signal by dividing a frequency of the pixel clock signal.

10. The AFE of claim 9, wherein the PGC further comprises:
a control voltage generator configured to generate the control voltage signal; and
a third frequency dividing circuit configured to divide a frequency of one of the M frequency-divided clock signals by a frequency division factor to generate a feedback signal, and transmit the feedback signal to the control voltage generator,
wherein the frequency division factor of the third frequency dividing circuit is a product of a frequency division factor of the first frequency dividing circuit and a frequency division factor of the second frequency dividing circuit.

11. A digital television (DTV) system comprising:
the AFE of claim 7;
a digital signal processor (DSP) configured to process the digital image signal received from the AFE to generate image data and adjust a horizontal synchronization frequency of the image data using the frequency-divided pixel clock signal; and
a display unit configured to display the image data.

12. A pixel clock generator (PCG) comprising:
a multiphase signal generator configured to generate frequency-divided clock signals according to a received horizontal synchronization signal, the frequency-divided clock signals each having a different phase; and
a pixel clock signal modulator configured to generate a pixel clock signal and a frequency-divided pixel clock signal based on at least two of the frequency-divided clock signals, the pixel clock signal modulator including a frequency dividing circuit configured to divide frequencies of each of the at least two frequency-divided clock signals to generate twice-frequency-divided clock signals, and the pixel clock signal is generated based on the twice-frequency-divided clock signals.

13. The PCG of claim 12, wherein the multiphase signal generator comprises:
a control voltage generator configured to generate a control voltage signal that varies based on a variation between phases of the horizontal synchronization signal and a feedback signal;
a voltage controlled oscillator configured to generate clock signals based on the control voltage signal, the generated clock signals each having different phases, a number N of the clock signals being a natural number;
a frequency-divided multiphase signal generating circuit configured to generate the frequency-divided clock signals based on the clock signals, the frequency-divided clock signals having frequencies that are integer multiples of frequencies of respective ones of the clock signals, a number M of the frequency-divided clock signals being a natural number greater than the number N of the clock signals; and
the frequency dividing circuit configured to divide a frequency of one of the M frequency-divided clock signals by a frequency division factor to generate a feedback signal, and transmit the feedback signal to the control voltage generator.

14. The PCG of claim 13, wherein the frequency-divided multiphase signal generating circuit is configured to receive the clock signals directly from the voltage controlled oscillator.

15. The PCG of claim 12, wherein the pixel clock signal modulator comprises:
a selection circuit configured to select the at least two frequency divided clock signals from the M frequency-divided clock signals;
a first frequency dividing circuit configured to generate at least two of the twice-frequency-divided clock signals having frequencies that are each an integer multiple of a frequency of respective ones of the at least two selected frequency-divided clock signals;
a clock modulation circuit configured to generate the pixel clock signal based on the selected at least two twice-frequency-divided clock signals; and
a second frequency dividing circuit configured to generate a frequency-divided pixel clock signal having a frequency that is an integer multiple a frequency of the pixel clock signal.

16. A digital television (DTV) system comprising:
an analog front end (AFE) including,
the pixel clock generator (PCG) of claim 12, and
an analog-to-digital converter (ADC) configured to convert an analog image signal into a digital image signal according to the pixel clock signal generated by the PCG; and
a digital signal processor (DSP) configured to generate image data, from the digital image signal, the generated image data having a horizontal synchronization frequency set according to the frequency-divided pixel clock signal received from the pixel clock generator.

* * * * *